United States Patent
Tsuchiya et al.

(10) Patent No.: US 10,712,295 B2
(45) Date of Patent: Jul. 14, 2020

(54) ELECTRON BEAM INSPECTION APPARATUS AND ELECTRON BEAM INSPECTION METHOD

(71) Applicant: NUFLARE TECHNOLOGY, INC., Kanagawa (JP)

(72) Inventors: Hideo Tsuchiya, Tokyo (JP); Masataka Shiratsuchi, Kawasaki (JP); Ryoichi Hirano, Tokyo (JP); Hideaki Hashimoto, Yokohama (JP); Riki Ogawa, Kawasaki (JP)

(73) Assignee: NUFLARE TECHNOLOGY, INC., Kanagawa (JP)

( * ) Notice: Subject to any disclaimer, the term of this patent is extended or adjusted under 35 U.S.C. 154(b) by 0 days.

(21) Appl. No.: 16/415,077

(22) Filed: May 17, 2019

(65) Prior Publication Data

US 2019/0369035 A1 Dec. 5, 2019

(30) Foreign Application Priority Data

Jun. 1, 2018 (JP) ................. 2018-106526

(51) Int. Cl.
*G01N 23/2251* (2018.01)
*H01J 37/22* (2006.01)
*H01J 37/20* (2006.01)
*H01J 37/147* (2006.01)

(52) U.S. Cl.
CPC ...... *G01N 23/2251* (2013.01); *H01J 37/1472* (2013.01); *H01J 37/20* (2013.01); *H01J 37/22* (2013.01); *G01N 2223/3307* (2013.01); *G01N 2223/426* (2013.01); *G01N 2223/6116* (2013.01)

(58) Field of Classification Search
CPC ....... G01N 23/2251; G01N 2223/3307; G01N 2223/426; G01N 2223/6116; H01J 37/1472; H01J 37/20; H01J 37/22
See application file for complete search history.

(56) References Cited

U.S. PATENT DOCUMENTS

2018/0031498 A1 2/2018 Shiratsuchi et al.

FOREIGN PATENT DOCUMENTS

JP 2018-017571 A 2/2018

*Primary Examiner* — Nicole M Ippolito
*Assistant Examiner* — Hanway Chang
(74) *Attorney, Agent, or Firm* — Cermak Nakajima & McGowan LLP; Tomoko Nakajima

(57) ABSTRACT

An electron beam inspection apparatus according to an embodiment includes a stage holding a substrate with a pattern; an electron beam column irradiating the substrate with multiple beams including a plurality of electron beams such that adjacent regions irradiated with the electron beams have an overlap portion therebetween; a first image storage unit storing a first inspection image acquired by irradiating a first inspection region of the substrate with the multiple beams; a second image storage unit storing a second inspection image acquired by irradiating a second inspection region of the substrate with the multiple beams; a correction coefficient storage unit storing a correction coefficient for correcting an image of the overlap portion; an image correction unit correcting an image of the overlap portion using the correction coefficient; and a comparison unit comparing the first inspection image with the second inspection image.

20 Claims, 8 Drawing Sheets

FIG.5

|  | NUMBER OF TIMES ELECTRON BEAMS OVERLAP EACH OTHER /NUMBER OF TIMES ELECTRON BEAMS ARE EMITTED | | | |
| --- | --- | --- | --- | --- |
|  | 0/1 | 1/2 | 2/3 | 3/4 |
| BRIGHTNESS AMPLITUDE a | a0 | a1 | a2 | a3 |
| OFFSET GRAYSCALE VALUE b | b0 | b1 | b2 | b3 |

ELECTRON BEAM INSPECTION APPARATUS AND ELECTRON BEAM INSPECTION METHOD

CROSS-REFERENCE TO RELATED APPLICATION

This application is based upon and claims the benefit of priority from Japanese Patent Applications No. 2018-106526, filed on Jun. 1, 2018, the entire contents of which are incorporated herein by reference.

FIELD OF THE INVENTION

Embodiments relate to an electron beam inspection apparatus and an electron beam inspection method. For example, embodiments relate to an electron beam inspection apparatus that irradiates a substrate with multiple beams including a plurality of electron beams to inspect a pattern formed on the substrate.

BACKGROUND OF THE INVENTION

In recent years, with an increase in the degree of integration and capacity of a large scale integrated circuit (LSI), a circuit line width required for semiconductor devices has been reduced. In a case where a semiconductor device is manufactured, a pattern of, for example, wiring lines or holes formed in a photomask (also referred to as a reticle) is transferred onto a wafer by a reduced size projection exposure apparatus. The pattern formed on the photomask is reduced and projected to form a fine pattern on the wafer.

It is necessary to reduce the number of defects on the wafer in order to achieve high production yield of semiconductor devices. Examples of the defect on the wafer include abnormality in the shape of the pattern, abnormality in the dimensions of the pattern, and foreign materials on the pattern. As the size of the pattern becomes smaller, the size of defects affecting production yield also becomes smaller. Therefore, a pattern inspection apparatus for inspecting patterns requires high defect detection capability.

In an optical pattern inspection apparatus, the wavelength of inspection light is reduced in order to improve the defect detection capability of the pattern inspection apparatus. For example, a far ultraviolet laser is used as a light source of the inspection light. The resolution of an acquired inspection image is improved by reducing the wavelength of the inspection light.

In addition, an electron-beam-type pattern inspection apparatus has also been achieved in order to improve the defect detection capability of the pattern inspection apparatus. The electron-beam-type pattern inspection apparatus emits electron beams onto a wafer, detects secondary electrons emitted from a pattern on the wafer or electrons reflected from the wafer, and acquires an inspection image. There is an electron-beam-type pattern inspection apparatus that irradiates a wafer with multiple beams including a plurality of electron beams and acquires an inspection image in order to improve inspection throughput.

In the electron-beam-type pattern inspection apparatus, there is a concern that an inspection image will be changed by the influence of the electrification of a pattern in a portion which is repeatedly irradiated with electron beams. There is a concern that the defect detection capability of the pattern inspection apparatus will be reduced due to the change in the inspection image caused by the influence of the electrification of the pattern.

SUMMARY OF THE INVENTION

According to an aspect of embodiments, there is provided an electron beam inspection apparatus including: a stage holding a substrate, a pattern being formed on a surface of the substrate; an electron beam column irradiating the substrate with multiple beams including a plurality of electron beams such that adjacent irradiation regions irradiated with the electron beams have an overlap portion therebetween; a first image storage unit storing a first inspection image acquired by irradiating a first inspection region of the substrate with the multiple beams; a second image storage unit storing a second inspection image acquired by irradiating a second inspection region of the substrate with the multiple beams; a correction coefficient storage unit storing a correction coefficient for correcting an image of the overlap portion; an image correction unit correcting an image of the overlap portion of the first inspection image and an image of the overlap portion of the second inspection image, using the correction coefficient; and a comparison unit comparing the corrected first inspection image with the corrected second inspection image.

According to another aspect of embodiments, there is provided an electron beam inspection apparatus including: a stage holding a substrate, a pattern being formed on a surface of the substrate; an electron beam column irradiating the substrate with multiple beams including a plurality of electron beams such that adjacent irradiation regions irradiated with the electron beams have an overlap portion therebetween; a first image storage unit storing an inspection image acquired by irradiating an inspection region of the substrate with the multiple beams; a second image storage unit storing a reference image generated on the basis of a design pattern corresponding to a pattern in the inspection region; a correction coefficient storage unit storing a correction coefficient for correcting an image of the overlap portion; an image correction unit correcting at least one of an image of the overlap portion of the inspection image and an image of a portion corresponding to the overlap portion in the reference image, using the correction coefficient; and a comparison unit comparing the corrected inspection image with the reference image, comparing the inspection image with the corrected reference image, or comparing the corrected inspection image with the corrected reference image.

According to still another aspect of embodiments, there is provided an electron beam inspection method including: acquiring a first inspection image by irradiating a first inspection region of a substrate having a pattern formed on a surface with first multiple beams including a plurality of first electron beams such that adjacent irradiation regions irradiated with the first electron beams have an overlap portion therebetween; acquiring a second inspection image by irradiating a second inspection region of the substrate with second multiple beams including a plurality of second electron beams such that adjacent irradiation regions irradiated with the second electron beams have an overlap portion therebetween; correcting an image of the overlap portion of the first inspection image and an image of the overlap portion of the second inspection image; and comparing the corrected first inspection image with the corrected second inspection image.

According to yet another aspect of embodiments, there is provided an electron beam inspection method including: acquiring an inspection image by irradiating an inspection region of a substrate having a pattern formed on a surface with multiple beams including a plurality of electron beams such that adjacent irradiation regions irradiated with the electron beams have an overlap portion therebetween; preparing a reference image generated on the basis of a design pattern corresponding to the pattern in the inspection region; correcting at least one of an image of the overlap portion of the inspection image and an image of a portion corresponding to the overlap portion in the reference image; and comparing the corrected inspection image with the reference image, comparing the inspection image with the corrected reference image, or comparing the corrected inspection image with the corrected reference image.

BRIEF DESCRIPTION OF THE DRAWINGS

FIG. 5 is a diagram illustrating an example of a correction table according to the first embodiment;

DETAILED DESCRIPTION OF THE EMBODIMENTS

Figure 1:
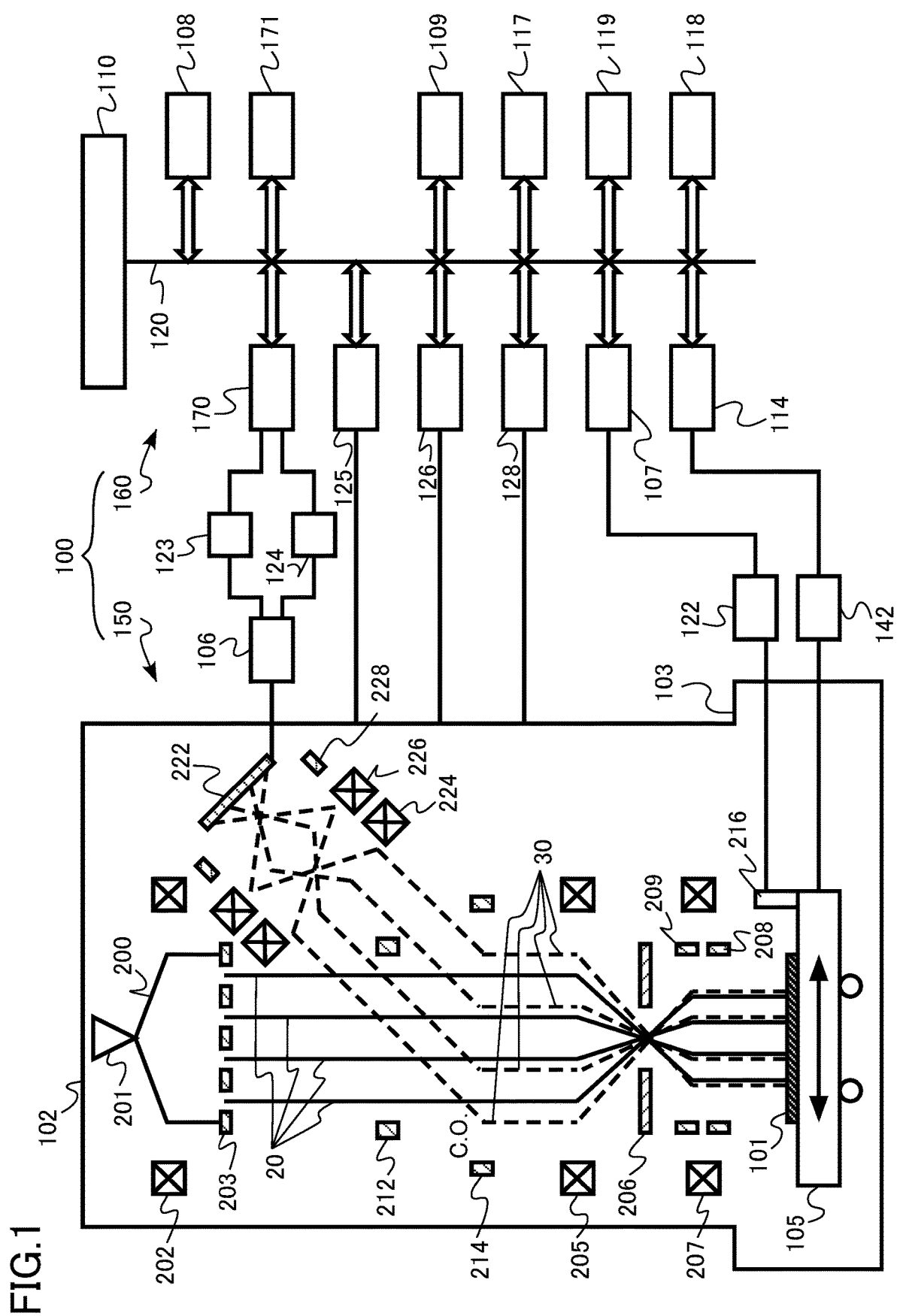
FIG. 1 is a conceptual diagram illustrating the configuration of an electron beam inspection apparatus according to a first embodiment.

Hereinafter, embodiments will be described with reference to the drawings.

First Embodiment

An electron beam inspection apparatus according to a first embodiment includes a stage holding a substrate, a pattern being formed on a surface of the substrate; an electron beam column irradiating the substrate with multiple beams including a plurality of electron beams such that adjacent irradiation regions irradiated with the electron beams have an overlap portion therebetween; a first image storage unit storing a first inspection image acquired by irradiating a first inspection region of the substrate with the multiple beams; a second image storage unit storing a second inspection image acquired by irradiating a second inspection region of the substrate with the multiple beams; a correction coefficient storage unit storing a correction coefficient for correcting an image of the overlap portion; an image correction unit correcting an image of the overlap portion of the first inspection image and an image of the overlap portion of the second inspection image, using the correction coefficient; and a comparison unit comparing the corrected first inspection image with the corrected second inspection image.

In addition, an electron beam inspection method according to the first embodiment includes acquiring a first inspection image by irradiating a first inspection region of a substrate having a pattern formed on a surface with first multiple beams including a plurality of first electron beams such that adjacent regions irradiated with the first electron beams have a first overlap portion therebetween; acquiring a second inspection image by irradiating a second inspection region of the substrate with second multiple beams including a plurality of second electron beams such that adjacent irradiation regions irradiated with the second electron beams have a second overlap portion therebetween; correcting an image of the first overlap portion of the first inspection image and an image of the second overlap portion of the second inspection image; and comparing the corrected first inspection image with the corrected second inspection image.

According to the electron beam inspection apparatus and the electron beam inspection method of the first embodiment, the brightness of the image of the overlap portion between the irradiation regions is corrected. A change in the image caused by the influence of the electrification of the pattern is corrected by the correction. Therefore, a reduction in defect detection capability caused by the electrification of the pattern is prevented.

For example, the electron beam inspection apparatus according to the first embodiment captures the images of the same pattern at different positions on a wafer to acquire two inspection images. Then, the electron beam inspection apparatus compares the two inspection images to inspect defects. The electron beam inspection apparatus according to the first embodiment is a pattern inspection apparatus. The electron beam inspection apparatus according to the first embodiment is a so-called "die-to-die inspection" apparatus. The wafer is an example of the substrate.

FIG. 1 is a conceptual diagram illustrating the configuration of the electron beam inspection apparatus according to the first embodiment.

An electron beam inspection apparatus 100 includes an electro-optical image acquisition mechanism 150 and a control system circuit 160 (control unit). The electro-optical image acquisition mechanism 150 includes an electron beam column 102 (electron lens barrel), an inspection chamber 103, a detection circuit 106, a first pattern memory 123 (first image storage unit), a second pattern memory 124 (second image storage unit), a stage driving mechanism 142, and a laser length measurement system 122.

The electron beam column 102 includes an electron gun 201, an illumination lens 202, a shaping aperture array substrate 203, a reducing lens 205, a limiting aperture substrate 206, an objective lens 207, a main deflector 208, a sub-deflector 209, a collective blanking deflector 212, a beam separator 214, a projection lens 224, a projection lens 226, a deflector 228, and a multi-detector 222.

The inspection chamber 103 includes an XY stage 105 that can be moved at least on the XY plane. For example, a substrate 101 on which a plurality of chip patterns to be inspected are formed is disposed on the XY stage 105. The substrate 101 includes a semiconductor substrate such as a silicon wafer. For example, the substrate 101 is disposed on the XY stage 105 with a pattern forming surface facing upward.

In addition, a mirror 216 that reflects laser light for laser length measurement emitted from the laser length measurement system 122 which is provided outside the inspection chamber 103 is provided on the XY stage 105. The multi-detector 222 is connected to the detection circuit 106 outside the electron beam column 102. The first pattern memory 123 and the second pattern memory 124 are connected to the detection circuit 106.

The control system circuit 160 includes a control computer 110 that controls the overall operation of the electron beam inspection apparatus 100. The control system circuit 160 includes a position circuit 107, a comparison circuit 108, an image correction circuit 170 (image correction unit), a stage control circuit 114, a lens control circuit 125, a blanking control circuit 126, a deflection control circuit 128, a correction coefficient storage unit 171, a storage device 109, a monitor 117, a memory 118, and a printer 119 which are connected to the control computer 110 through a bus 120.

The first pattern memory 123 stores a first inspection image acquired by irradiating a first inspection region of the substrate 101 with multiple beams. The second pattern memory 124 stores a second inspection image acquired by irradiating a second inspection region of the substrate 101 with the multiple beams.

The correction coefficient storage unit 171 has a function of storing a correction coefficient for correcting an image of an overlap portion between the first inspection image and the second inspection image. The correction coefficient storage unit 171 is, for example, a hard disk drive or a semiconductor memory.

The image correction circuit 170 has a function of correcting the image of the overlap portion of the first inspection image and the image of the overlap portion of the second inspection image, using the correction coefficient stored in the correction coefficient storage unit 171.

The XY stage 105 is driven by the stage driving mechanism 142 under the control of the stage control circuit 114. The stage driving mechanism 142 is, for example, a three-axis (X-Y-θ) motor that is driven in the X direction, the Y direction, the θ direction. An X motor, a Y motor, and a θ motor forming the three-axis (X-Y-θ) motor are, for example, step motors.

The movement position of the XY stage 105 is measured by the laser length measurement system 122 and is transmitted to the position circuit 107. The laser length measurement system 122 receives light reflected from the mirror 216 to measure the position of the XY stage 105 using the principle of a laser interference method.

A high-voltage power supply circuit (not illustrated) is connected to the electron gun 201. In a case where the high-voltage power supply circuit applies an accelerating voltage, an electron beam 200 is emitted from the electron gun 201.

For example, electromagnetic lenses are used as the illumination lens 202, the reducing lens 205, the objective lens 207, the projection lens 224, and the projection lens 226. The illumination lens 202, the reducing lens 205, the objective lens 207, the projection lens 224, and the projection lens 226 are controlled by the lens control circuit 125. The beam separator 214 is also controlled by the lens control circuit 125.

The collective blanking deflector 212 and the deflector 228 are controlled by the blanking control circuit 126. Each of the main deflector 208 and the sub-deflector 209 is configured by a group of at least four electrodes and is controlled by the deflection control circuit 128.

Figure 2:
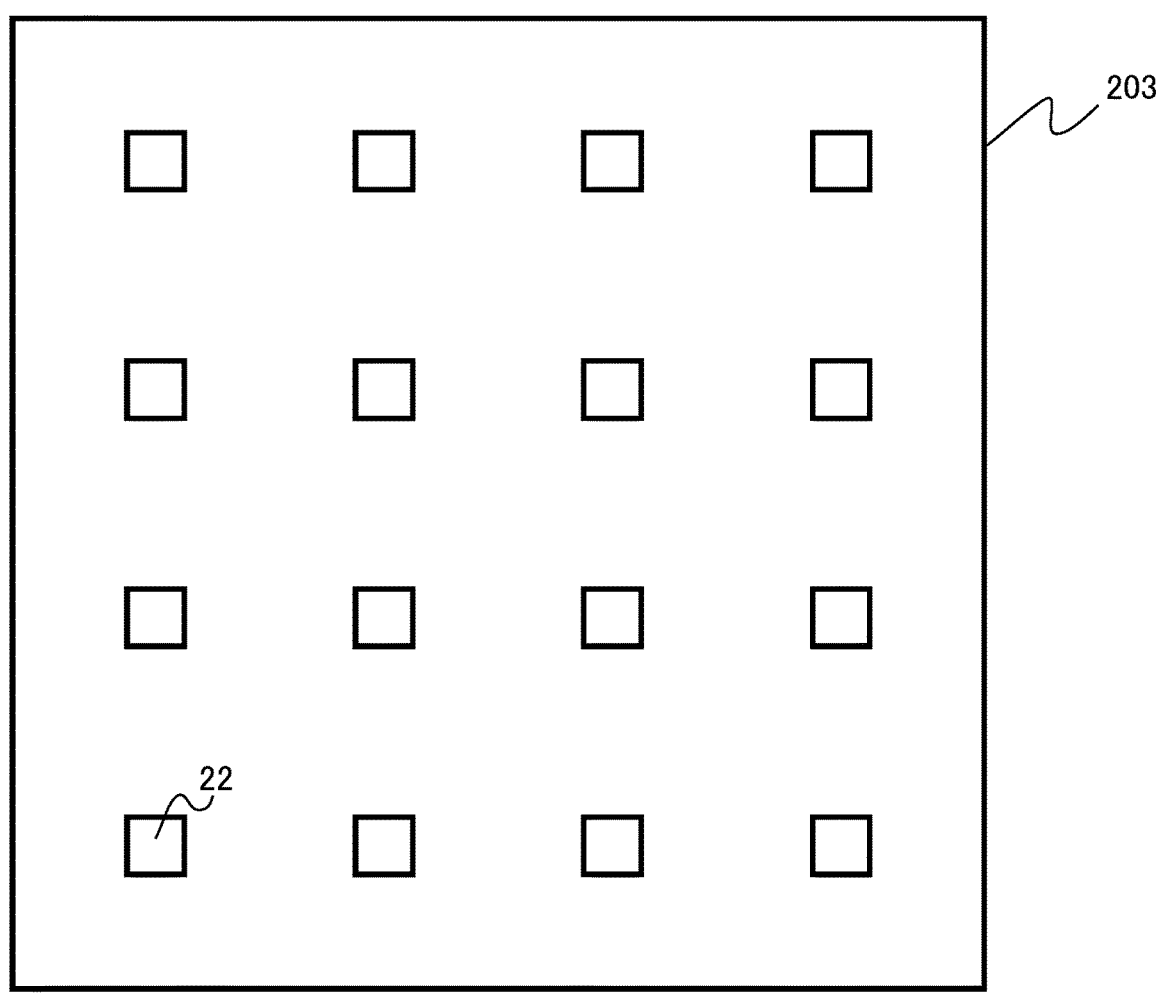
FIG. 2 is a conceptual diagram illustrating an example of a shaping aperture array substrate according to the first embodiment.

FIG. 2 is a conceptual diagram illustrating an example of the shaping aperture array substrate according to the first embodiment. Four-by-four holes 22, that is, a total of 16 holes 22 are formed in the shaping aperture array substrate 203 with a predetermined array pitch. Some of the electron beams 200 pass through the plurality of holes 22 and multiple beams 20 forming 16 electron beams are formed. In addition, the number of holes 22 in the shaping aperture array substrate 203 is not limited to 16.

The electron beam column 102 irradiates the substrate 101 with the multiple beams 20 such that adjacent irradiation regions irradiated with the electron beams overlap each other.

FIGS. 1 and 2 illustrate configurations required to describe the first embodiment. The electron beam inspection apparatus 100 may have other configurations that are generally required.

Next, the electron beam inspection method according to the first embodiment will be described.

Figure 3:
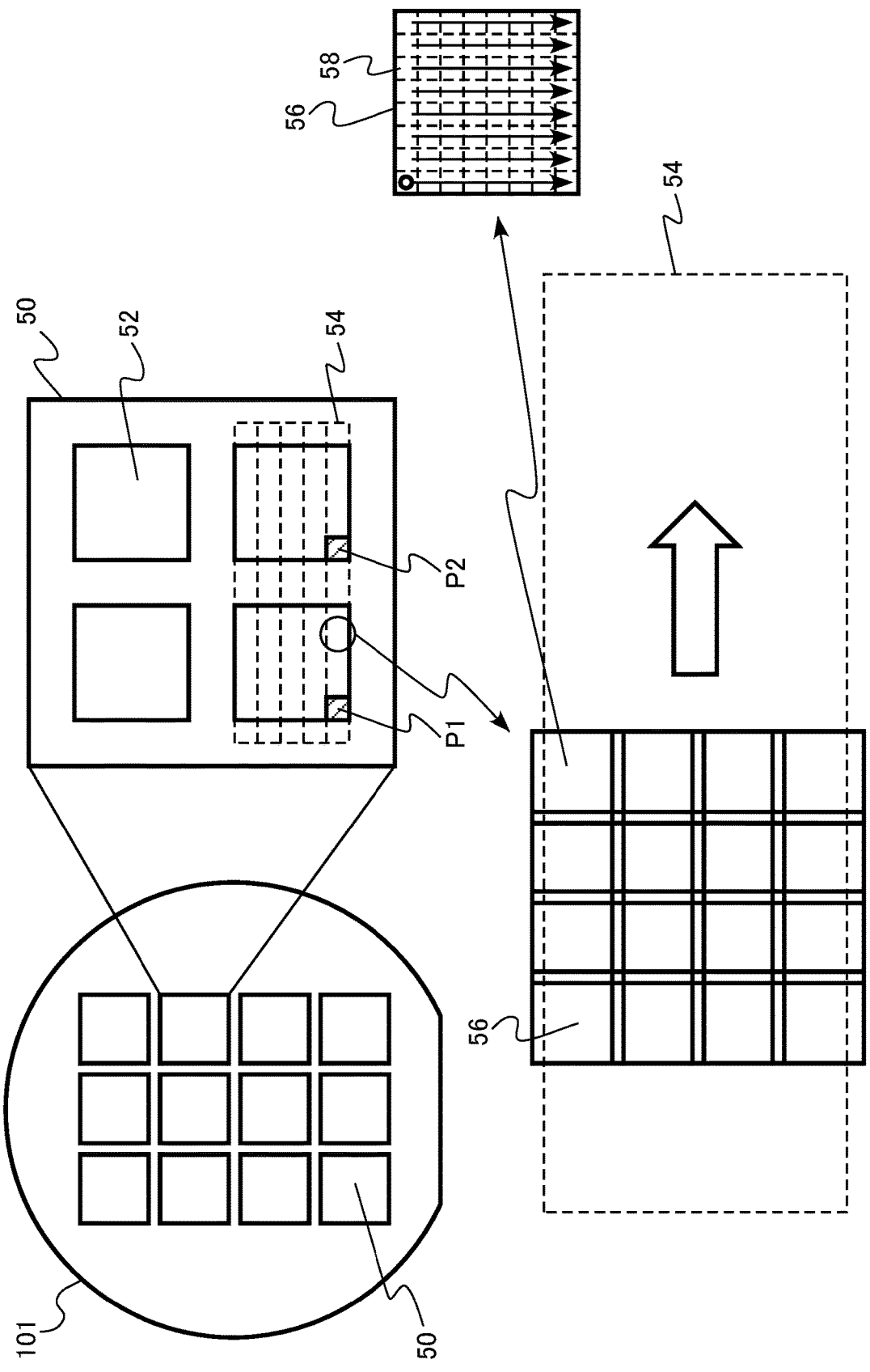
FIG. 3 is a diagram describing an electron beam inspection method according to the first embodiment.

FIG. 3 is a diagram describing the electron beam inspection method according to the first embodiment.

The substrate 101 to be inspected is, for example, a semiconductor wafer. The substrate 101 is placed on the XY stage 105. A plurality of chips 50 are formed on the substrate 101. Each of the chips 50 has, for example, a pattern of wiring lines or holes. The pattern is formed by, for example, a photoresist, a conductive film, or an insulating film.

For example, a plurality of blocks 52 having the same pattern are formed in one chip 50. FIG. 3 illustrates a case where the number of blocks 52 is four. For example, in a case where the chip 50 is a semiconductor memory, the block 52 is a memory cell array.

For example, the electron beam inspection method according to the first embodiment compares the same pattern regions included in different blocks 52 to perform inspection. For example, it is assumed that P1 in FIG. 3 is the first inspection region and P2 in FIG. 3 is the second inspection region and the patterns of the first and second inspection regions are compared to each other.

The entire shaping aperture array substrate 203 is substantially vertically irradiated with the electron beams 200 emitted from the electron gun 201 by the illumination lens 202. A plurality of rectangular holes 22 are formed in the shaping aperture array substrate 203 as illustrated in FIG. 2 and a region including all of the plurality of holes 22 is irradiated with the electron beams 200. In a case where the electron beams 200 pass through the plurality of holes 22 of the shaping aperture array substrate 203, for example, the multiple beams 20 including the plurality of rectangular electron beams are formed. Each of the plurality of holes 22 may have shapes other than the rectangle. For example, the shape may be a circle.

The multiple beams 20 form a crossover (C.O.). The multiple beams 20 pass through the beam separator 214 provided at a crossover position, are reduced by the reducing lens 205, and travel to a center hole formed in the limiting aperture substrate 206.

The collective blanking deflector 212 is provided between the shaping aperture array substrate 203 and the reducing lens 205. In a case where all of the multiple beams 20 are collectively deflected by the collective blanking deflector 212, the multiple beams 20 are shielded while deviating from the center hole of the limiting aperture substrate 206. In contrast, in a case where the multiple beams 20 are not deflected by the collective blanking deflector 212, the multiple beams 20 pass through the center hole of the limiting aperture substrate 206 as illustrated in FIG. 1.

Blanking is controlled by turning on and off the collective blanking deflector 212 to collectively control the turn-on and turn-off the multiple beams 20. As such, the limiting aperture substrate 206 shields the multiple beams 20 which have been reflected by the collective blanking deflector 212 so as to be turned off.

The multiple beams 20 which have passed through the limiting aperture substrate 206 between a beam-on state and a beam-off state are focused by the objective lens 207 to form a pattern image with a desired reduction ratio. Then, all of the multiple beams 20 are collectively deflected in the same direction by the main deflector 208 and the sub-deflector 209 and each position of the substrate 101 is irradiated with each of the electron beams forming the multiple beams 20.

16 (=4×4) irradiation regions are irradiated with the multiple beams 20 at a time. For example, a region having the same size as 16 irradiation regions 56 irradiated with the multiple beams 20 is an inspection region which is the unit of comparison. For example, in FIG. 3, P1 is the first inspection region and P2 is the second inspection region.

The irradiation regions 56 are irradiated with each of the electron beams forming the multiple beams 20. The irradiation region 56 is scanned with each electron beam by the sub-deflector 209. For example, the irradiation region 56 is divided into a plurality of mesh-like mesh regions with the size of the electron beam. Each mesh region is a measurement pixel 58 (unit irradiation region). FIG. 3 illustrates a case where one irradiation region 56 includes 64 (=8×8) measurement pixels 58.

The multiple beams 20 are moved on the chip 50 in the horizontal direction by the movement of the XY stage 105 having the substrate 101 placed thereon as represented by a white arrow. The multiple beams 20 are moved along a stripe region 54. For example, all of the patterns of the blocks 52 in the chip 50 are irradiated with the multiple beams 20 by the movement of the multiple beams 20 along a plurality of stripe regions 54.

In a case where the substrate 101 is irradiated with the multiple beams 20, a plurality of secondary electron beams are emitted from the substrate 101 (multiple secondary electron beams 30). In addition, some of the multiple beams 20 are reflected from the surface of the substrate 101 and reflected electrons (not illustrated) are generated.

The multiple secondary electron beams 30 are deflected to the center of the multiple secondary electron beams 30 by the objective lens 207. Then, the multiple secondary electron beams 30 travel to the center hole of the limiting aperture substrate 206. The multiple secondary electron beams 30 transmitted through the limiting aperture substrate 206 are deflected by the reducing lens 205 so as to be substantially parallel to the optical axis and travel to the beam separator 214.

The beam separator 214 generates the electric field and the magnetic field so as to be orthogonal to each other in a plane that is orthogonal to the direction in which the multiple beams 20 travel, that is, the direction of the optical axis. The electric field is applied in the same direction, regardless of the traveling direction of electrons. On the other hand, the magnetic field is applied according to Fleming's left-hand rule. Therefore, the direction of the force of electrons can be changed by the penetration direction of electrons.

For the multiple beams 20 that are incident on the beam separator 214 from the upper side, force caused by the electric field and force caused by the magnetic field cancel each other. Therefore, the multiple beams 20 travel straight downward. In contrast, for the multiple secondary electron beams 30 that are incident on the beam separator 214 from the lower side, both force caused by the electric field and force caused by the magnetic field act in the same direction. Therefore, the multiple secondary electron beams 30 are obliquely bent upward.

The multiple secondary electron beams 30 which have been obliquely bent upward are projected onto the multi-detector 222 by the projection lens 224 and the projection lens 226 while being deflected. The multi-detector 222 detects the projected multiple secondary electron beams 30.

The multi-detector 222 has a diode-type two-dimensional sensor (not illustrated). Therefore, the multi-detector 222 detects the multiple secondary electron beams 30 corresponding to each electron beam of the multiple beams 20. Then, the detection circuit 106 generates a detection image of the inspection region.

The first inspection image acquired by irradiating the first inspection region P1 of the substrate 101 with the multiple beams is stored in the first pattern memory 123 (first image storage unit). The second inspection image acquired by irradiating the second inspection region P2 of the substrate 101 with the multiple beams is stored in the second pattern memory 124 (second image storage unit).

As illustrated in FIG. 3, the substrate 101 is irradiated with the multiple beams 20 including a plurality of electron beams such that adjacent irradiation regions 56 irradiated with the electron beams overlap each other. This is a measure to avoid the occurrence of a portion which is not irradiated with the electron beams and is excluded from the inspection region. Therefore, the inspection region includes a portion that is irradiated with the electron beams only one time, that is, a portion in which electron beams do not overlap each other and a portion that is irradiated with the electron beams two or more times, that is, a portion in which the electron beams overlap each other.

Figure 4A:
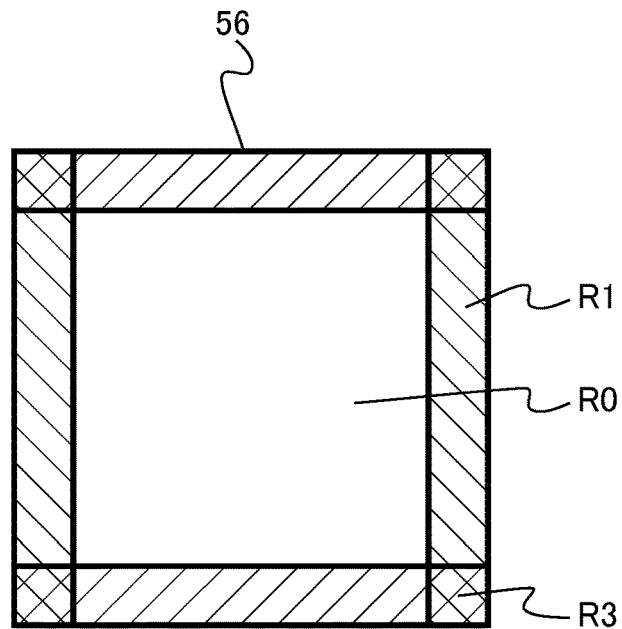
FIGS. 4A and 4B are diagrams describing an irradiation region according to the first embodiment.
Figure 4B:
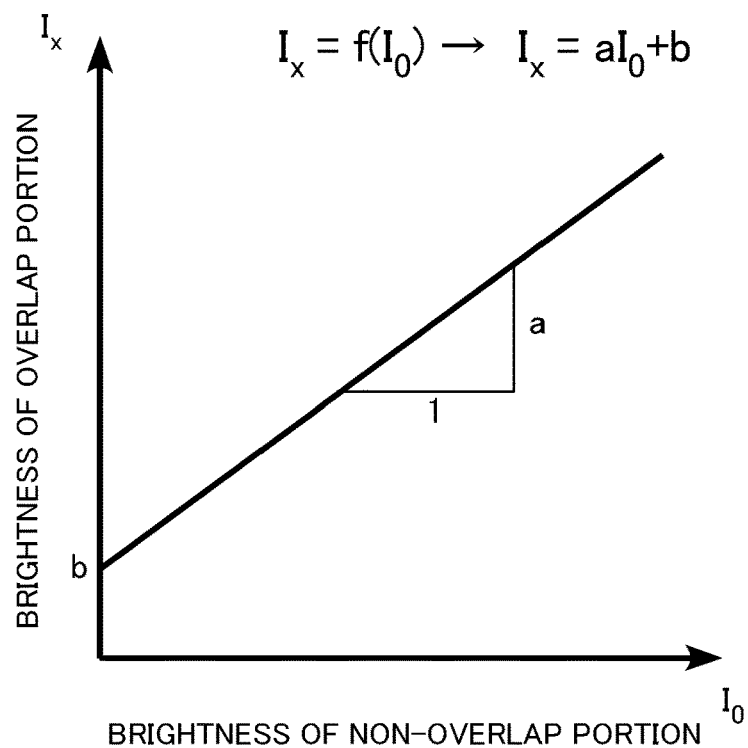

FIGS. 4A and 4B are diagrams describing the irradiation region according to the first embodiment.

FIG. 4A is a diagram illustrating the overlap state of the electron beams in one irradiation region 56. The irradiation region 56 includes a region R0 in which the number of times the electron beams overlap each other is 0, a region R1 in which the number of times the electron beams overlap each other is 1, and a region R3 in which the number of times the electron beams overlap each other is 3. The numbers of times the region R0, the region R1, and the region R3 are irradiated with the electron beams are 1, 2, and 4, respectively. The irradiation regions 56 may overlap each other such that a region in which the number of times the electron beams overlap each other is 2 is generated. Each of the region R1 and the region R3 is an example of the overlap portion.

FIG. 4B is a diagram illustrating an example of the correlation between the brightness ($I_0$) of the pattern of the portion (region R0) in which the electron beams do not overlap each other and the brightness ($I_x$) of the pattern of the overlap portion (region Rx (x=1, 2, 3)). Here, the term "brightness" indicates the value of the brightness of each measurement pixel 58 in the irradiation region 56. The brightness of each measurement pixel 58 is defined by, for example, 256 grayscale values. The brightness of each measurement pixel 58 corresponds to the amount of secondary electrons in each measurement pixel 58 detected by the multi-detector 222.

The brightness ($I_0$) of the pattern of the portion in which the electron beams do not overlap each other is different from the brightness ($I_x$) of the pattern of the overlap portion. This is because the amount of secondary electrons generated by the influence of the electrification of the pattern varies in the overlap portion.

It is assumed that the correlation between the brightness ($I_0$) of the pattern of the portion in which the electron beams do not overlap each other and the brightness ($I_x$) of the pattern of the overlap portion is represented by $I_x=f(I_0)$. FIG. 4B illustrates a case where the correlation is represented by a linear function. That is, $I_x=f(I_0)$ is $I_x=aI_0+b$. Here, the coefficient a is referred to as a brightness amplitude and the coefficient b is referred to as an offset grayscale value.

FIG. 5 is a diagram illustrating an example of a correction table according to the first embodiment. In the correction table, the value of the brightness amplitude a and the offset grayscale value b which are the correction coefficients are described according to the number of times the electron beams overlap each other. The correction coefficient storage unit 171 stores, for example, the correction table illustrated in FIG. 5.

For example, the correction coefficient is calculated by performing calibration before the pattern the substrate 101 is inspected. The calibration is performed using the substrate 101 or a dedicated substrate.

Figure 6A:
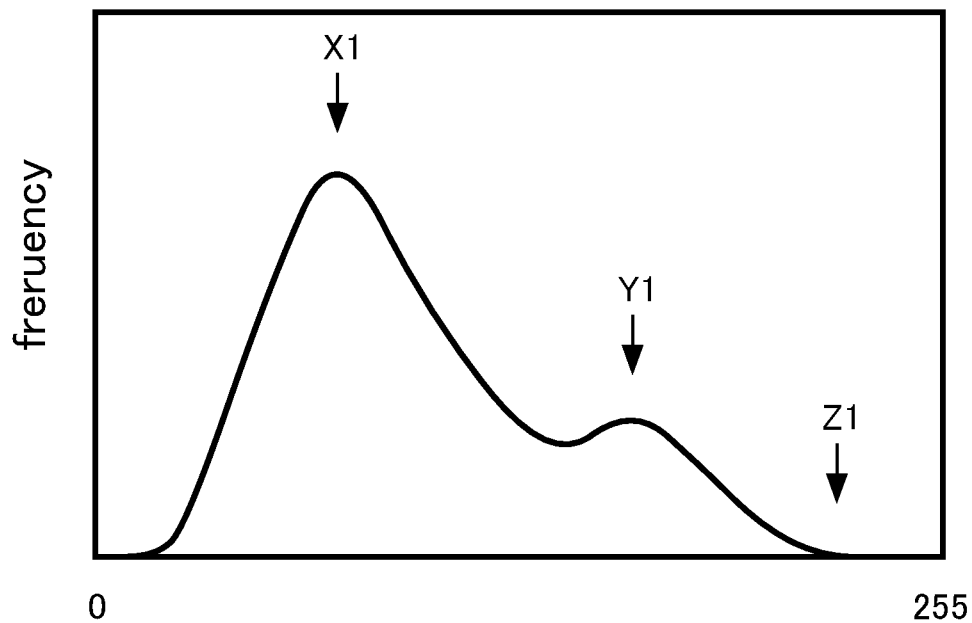
FIGS. 6A and 6B are diagrams describing an example of a method for calculating a correction coefficient according to the first embodiment.
Figure 6B:
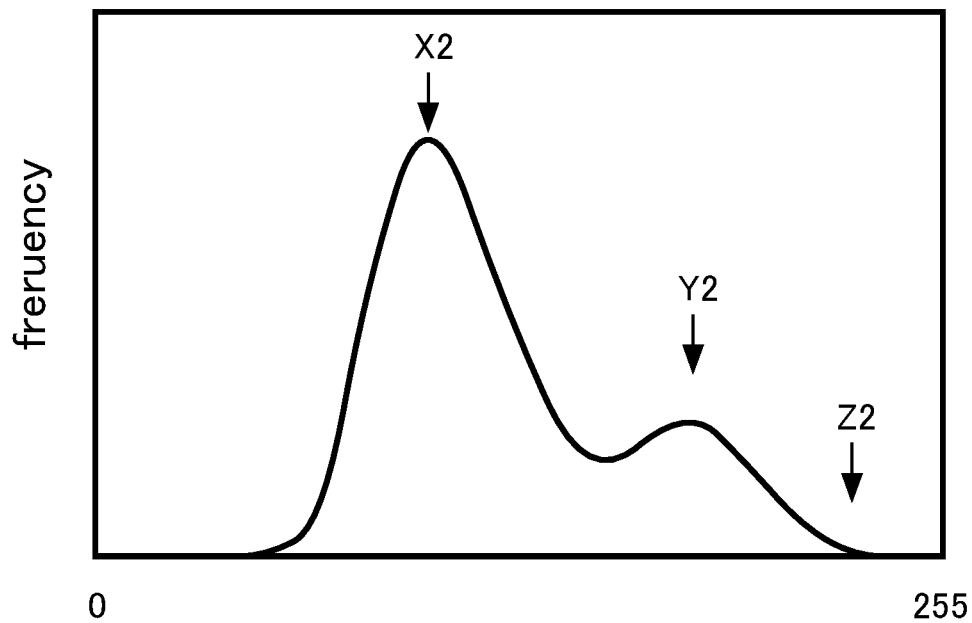

FIGS. 6A and 6B are diagrams describing an example of a method for calculating the correction coefficient according to the first embodiment. FIGS. 6A and 6B show a histogram of the frequency of brightness with respect to the grayscale value of the brightness of the pattern. FIG. 6A is a histogram of an image in a case where the electron beams are emitted one time and FIG. 6B is a histogram of an image in a case where the electron beams are emitted two times.

For example, a grayscale value X1 of a first peak, a grayscale value Y1 of a second peak, and a grayscale value Z1 of the highest brightness are calculated from FIG. 6A. Then, a grayscale value X2 of a first peak, a grayscale value Y2 of a second peak, and a grayscale value Z2 of the highest brightness are calculated from FIG. 6B. The grayscale values calculated from two histograms are fitted to calculate the value of the brightness amplitude a and offset grayscale value b which are the correction coefficients.

The image of the overlap portion of the first inspection image and the image of the overlap portion of the second inspection image are corrected by the image correction circuit 170. Specifically, the correlation between the brightness ($I_0$) of the pattern of a non-overlap portion and the brightness ($I_x$) of the pattern of the overlap portion is determined using the correction coefficients which are described in the correction table stored in the correction coefficient storage unit 171. Then, the brightness ($I_x$) of the pattern of the overlap portion is converted into the brightness ($I_0$) of the pattern of the non-overlap portion from the correlation.

The brightness of the first inspection image and the brightness of the second inspection image are converted into brightness in a case where the electron beams do not overlap each other by the correction. In other words, the first inspection image and the second inspection image also include the overlap portion of the electron beams and are equivalent to images in a case where the electron beams are emitted only one time.

The comparison circuit 108 compares the corrected first inspection image with the corrected second inspection image. The comparison circuit 108 compares the first inspection image with the second inspection image, recognizes the difference between the patterns, and determines whether there is a defect.

Next, the function and effect of the electron beam inspection apparatus and the electron beam inspection method according to the first embodiment will be described.

Figure 7A:
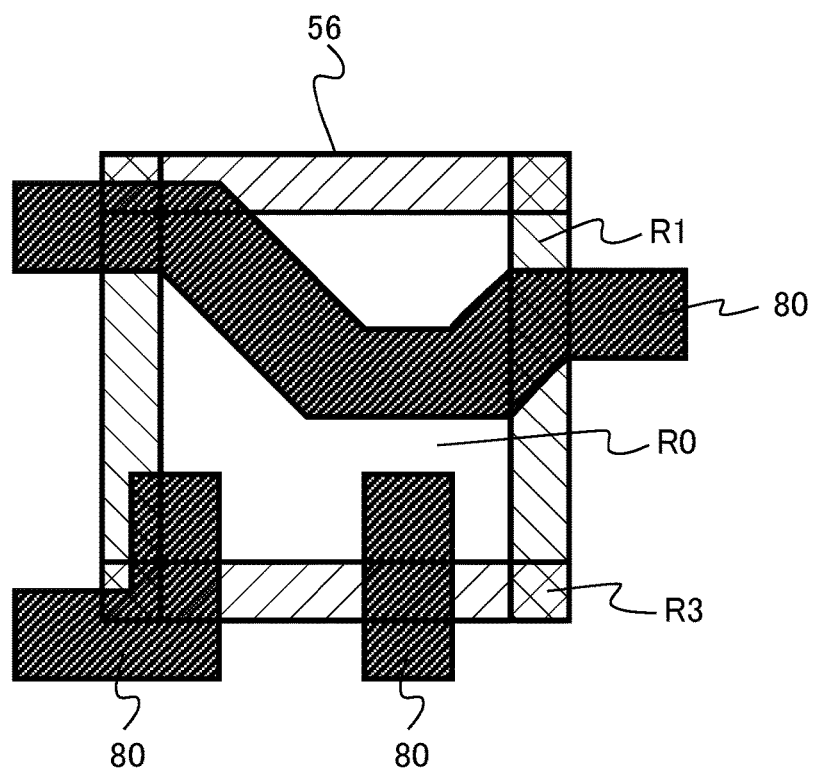
FIGS. 7A and 7B are diagrams illustrating a positional relationship between the irradiation region and a pattern according to the first embodiment.
Figure 7B:
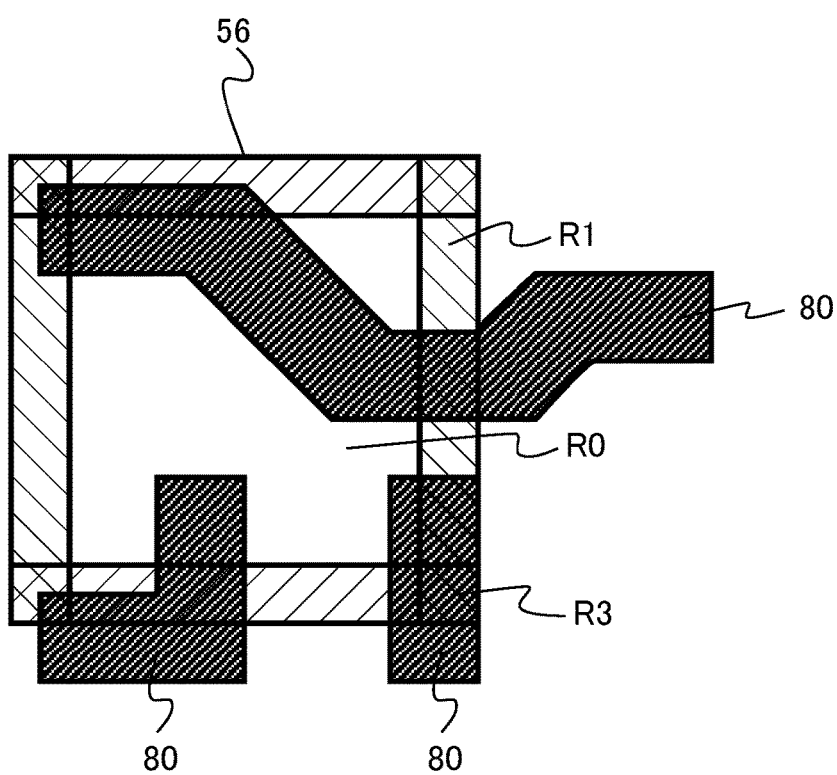

FIGS. 7A and 7B are diagrams illustrating a positional relationship between an irradiation region and a pattern in the first embodiment. FIG. 7A illustrates the positional relationship between the irradiation region 56 and a pattern 80 in a portion of the first inspection region P1. FIG. 7B illustrates the positional relationship between the irradiation region 56 and the pattern 80 in a portion of the second inspection region P2.

As illustrated in FIGS. 7A and 7B, in some cases, the positional relationship between the irradiation region 56 and the pattern 80 deviates between the first inspection region P1 and the second inspection region P2. In this case, the relationship between the regions R0, R1, and R2 and the pattern 80 also deviates. Therefore, the images of the patterns 80 which need to be the same in the first inspection region P1 and the second inspection region P2 in a case where there is no defect are different from each other due to the influence of electrification. As a result, there is a concern that an erroneous determination that there is a defect will be made even in a case where there are no defects in practice. Therefore, there is a concern that the defect detection capability of the electron beam inspection apparatus and the electron beam inspection method will be reduced.

According to the electron beam inspection apparatus and the electron beam inspection method of the first embodiment, the brightness of the portion in which the emission of the electron beams overlaps is corrected. In other words, a change in the inspection image in the portion in which the emission of the electron beams overlaps is corrected. Therefore, it is possible to achieve an electron beam inspection apparatus and an electron beam inspection method with the improved defect detection capability.

Second Embodiment

An electron beam inspection apparatus according to a second embodiment includes a stage having a substrate placed thereon, a pattern being formed on a surface of the substrate; an electron beam column irradiating the substrate with multiple beams including a plurality of electron beams such that adjacent regions irradiated with the electron beams have an overlap portion therebetween; a first image storage unit storing an inspection image acquired by irradiating an inspection region of the substrate with the multiple beams; a second image storage unit storing a reference image generated on the basis of a design pattern corresponding to a pattern in the inspection region; a correction coefficient storage unit storing a correction coefficient for correcting an image of the overlap portion; an image correction unit correcting at least one of an image of the overlap portion of the inspection image and an image of a portion corresponding to the overlap portion in the reference image, using the correction coefficient; and a comparison unit comparing the corrected inspection image with the reference image, comparing the inspection image with the corrected reference image, or comparing the corrected inspection image with the corrected reference image.

An electron beam inspection method according to the second embodiment includes acquiring an inspection image by irradiating an inspection region of a substrate having a pattern formed on a surface with multiple beams including a plurality of electron beams such that adjacent regions irradiated with the electron beams have an overlap portion therebetween; preparing a reference image generated on the basis of a design pattern corresponding to a pattern in the inspection region; correcting at least one of an image of the overlap portion of the inspection image and an image of a portion corresponding to the overlap portion in the reference image; and comparing the corrected inspection image with the reference image, comparing the inspection image with the corrected reference image, or comparing the corrected inspection image with the corrected reference image.

The electron beam inspection apparatus and the electron beam inspection method according to the second embodiment compare an inspection image obtained by capturing an image of a pattern on a wafer with a reference image created from design data corresponding to the pattern to perform defect inspection. The electron beam inspection apparatus according to the second embodiment differs from the electron beam inspection apparatus according to the first embodiment in that it performs "die-to-database inspection". Hereinafter, the description of a portion of the same content as that in the first embodiment will not be repeated.

According to the electron beam inspection apparatus and the electron beam inspection method of the second embodiment, the brightness of the image of the portion in which the irradiation regions overlap each other is corrected. A change in the image caused by the influence of the electrification of the pattern is corrected by the above-mentioned correction. Therefore, a reduction in defect detection capability caused by the electrification of the pattern is prevented.

Figure 8:
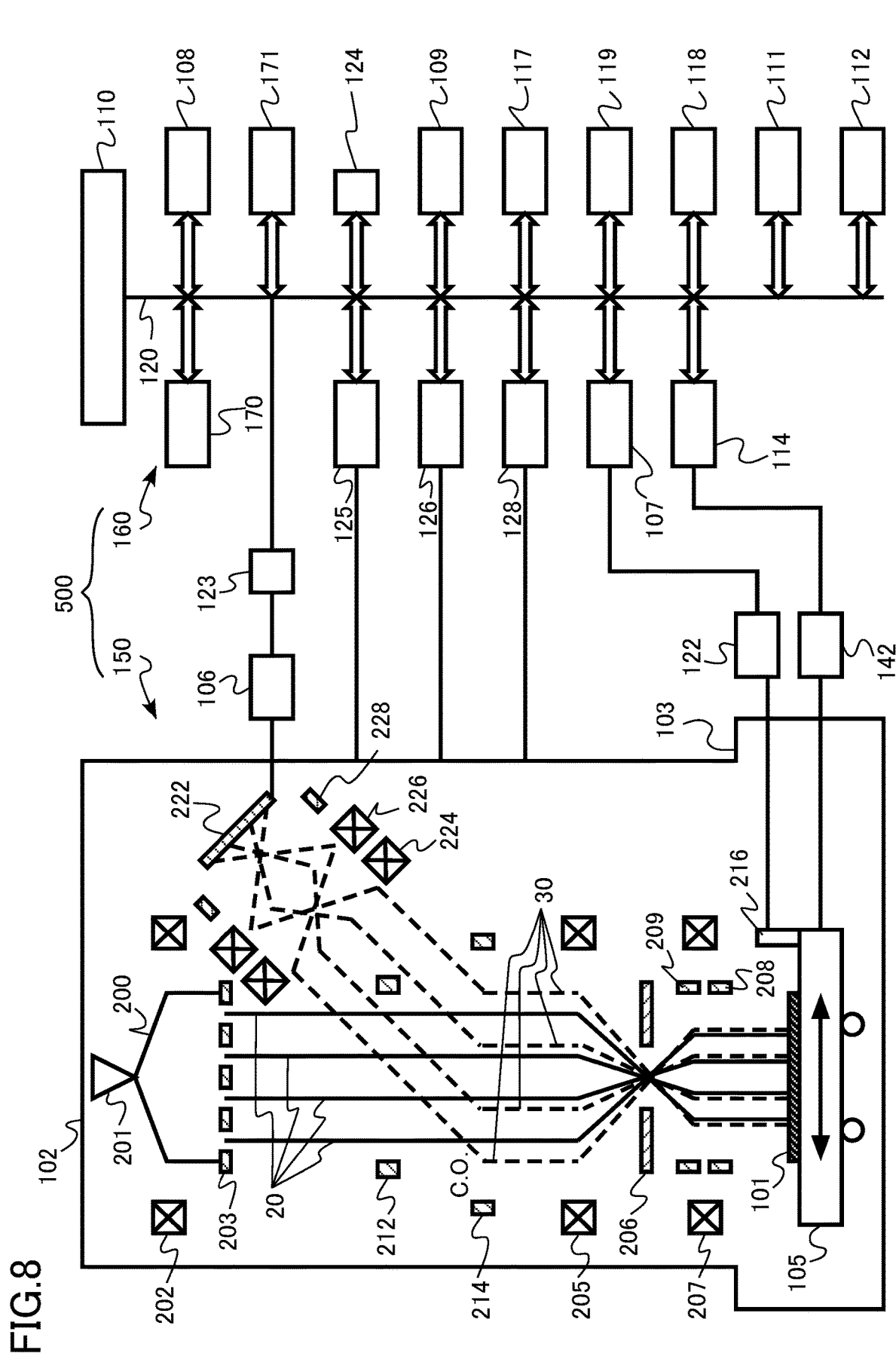
FIG. 8 is a conceptual diagram illustrating the configuration of an electron beam inspection apparatus according to a second embodiment.

FIG. 8 is a conceptual diagram illustrating the configuration of the electron beam inspection apparatus according to the second embodiment.

An electron beam inspection apparatus 500 includes an electro-optical image acquisition mechanism 150 and a control system circuit 160 (control unit). The electro-optical image acquisition mechanism 150 includes an electron beam column 102 (electron lens barrel), an inspection chamber 103, a detection circuit 106, a first pattern memory 123 (first image storage unit), a stage driving mechanism 142, and a laser length measurement system 122.

The electron beam column 102 includes an electron gun 201, an illumination lens 202, a shaping aperture array substrate 203, a reducing lens 205, a limiting aperture substrate 206, an objective lens 207, a main deflector 208, a sub-deflector 209, a collective blanking deflector 212, a beam separator 214, a projection lens 224, a projection lens 226, a deflector 228, and a multi-detector 222.

The inspection chamber 103 includes an XY stage 105 that can be moved at least on the XY plane. In addition, a mirror 216 that reflects laser light for laser length measurement emitted from the laser length measurement system 122 which is provided outside the inspection chamber 103 is provided on the XY stage 105. The multi-detector 222 is connected to the detection circuit 106 outside the electron beam column 102. The first pattern memory 123 is connected to the detection circuit 106.

The control system circuit 160 includes a control computer 110 that controls the overall operation of the electron beam inspection apparatus 500. The control system circuit 160 includes a position circuit 107, a comparison circuit 108, an image correction circuit 170 (image correction unit), a second pattern memory 124 (second image storage unit), a pattern generation circuit 111, a reference circuit 112, a stage control circuit 114, a lens control circuit 125, a blanking control circuit 126, a deflection control circuit 128, a correction coefficient storage unit 171, a storage device 109, a monitor 117, a memory 118, and a printer 119 which are connected to the control computer 110 through a bus 120.

The position circuit 107, the comparison circuit 108, the image correction circuit 170 (image correction unit), the pattern generation circuit 111, the reference circuit 112, the stage control circuit 114, the lens control circuit 125, the blanking control circuit 126, and the deflection control circuit 128 are, for example, program-control computers.

The first pattern memory 123 stores an inspection image acquired by irradiating an inspection region of the substrate 101 with multiple beams. The second pattern memory 124 stores a reference image that is generated on the basis of a design pattern corresponding to a pattern in the inspection region.

For example, the reference image is generated from design data including the design pattern by the pattern generation circuit 111 and the reference circuit 112. The design data is stored in, for example, the storage device 109.

The correction coefficient storage unit 171 has a function of storing a correction coefficient for correcting an image of an overlap portion of the inspection image or the reference image. The correction coefficient storage unit 171 is, for example, a hard disk drive or a semiconductor memory.

The image correction circuit 170 has a function of correcting the image of the overlap portion of the inspection image and/or the image of the overlap portion of the reference image, using the correction coefficient stored in the correction coefficient storage unit 171.

FIG. 8 illustrates configurations required to describe the second embodiment. The electron beam inspection apparatus 500 may have other configurations that are generally required.

Next, the electron beam inspection method according to the second embodiment will be described.

In the electron beam inspection method according to the second embodiment, the pattern of the inspection region on the substrate 101 is compared to the design pattern corresponding to the inspection region. For example, in FIG. 3, P1 is the inspection region.

The reference image generated on the basis of the design pattern corresponding to a pattern in the inspection region is prepared. The reference image is generated from design data including the design pattern by the pattern generation circuit 111 and the reference circuit 112. For example, the control computer 110 reads the design data from the storage device 109 to the pattern generation circuit 111. The pattern generation circuit 111 generates design image data obtained by partitioning the design data with pixels having the same size as the measurement pixels 58 of the inspection image.

The control computer 110 transmits the design image data to the reference circuit 112. The reference circuit 112 performs filter processing suitable for the design image data. The inspection image obtained from the detection circuit 106 is in a state in which a filter has been applied to the corresponding design data through a pattern forming process or an electron optical system. The reference circuit 112 performs an appropriate filtering process to convert the design image data into a reference image that can be compared to the inspection image.

The image of an overlap portion of the inspection region of the inspection image is corrected by the image correction circuit 170. Specifically, a correlation between the brightness ($I_0$) of the pattern of a non-overlap portion and the brightness ($I_x$) of the pattern of the overlap portion is determined using the correction coefficients which are described in the correction table stored in the correction coefficient storage unit 171. Then, the brightness ($I_x$) of the pattern of the overlap portion is converted into the brightness ($I_0$) of the pattern of the non-overlap portion from the correlation.

The brightness of the inspection image is converted into the brightness of the pattern in a case where the electron beams do not overlap each other by the correction. In other words, the inspection image also includes the overlap portion of the electron beams and is equivalent to an image in a case where the electron beams are emitted only one time.

The comparison circuit 108 compares the corrected inspection image with the reference image. The comparison circuit 108 compares the inspection image with the reference image, recognizes the difference between the patterns, and determines whether there is a defect.

In addition, the inspection image may not be corrected, but the reference image may be corrected. In this case, for example, an image of a portion corresponding to the overlap portion of the electron beams in the reference image is corrected so as to be an image obtained by emitting the electron beams such that the electron beams overlap each other. In addition, both the overlap portion of the inspection image and the overlap portion of the reference image may be corrected.

According to the electron beam inspection apparatus and the electron beam inspection method of the second embodiment, the brightness of the portion in which the electron beams are emitted so as to overlap each other is corrected. In other words, a change in the inspection image in the portion in which the electron beams are emitted so as to overlap each other is corrected. Alternatively, the reference image in the portion in which the electron beams are emitted so as to overlap each other is changed. Therefore, it is possible to achieve an electron beam inspection apparatus and an electron beam inspection method with the improved defect detection capability.

In the above description, the content of the process or operation of the component described as a "~ unit" or a "~ circuit" can be configured by a program that can be executed by a computer. Alternatively, the process or the operation may be performed by not only a program which is software but also a combination of hardware and software. Alternatively, the process or the operation may be performed by a combination with firmware. In a case where the content of the process or the operation is configured by a program, the program is recorded on a recording medium, such as a magnetic disk device, a magnetic tape device, an FD, or a read only memory (ROM). For example, the program is recorded on the memory 118.

The embodiments have been described above with reference to specific examples. However, embodiments are not limited to the specific examples.

For example, an electron beam inspection apparatus and an electron beam inspection method according to a combination of the first embodiment and the second embodiment may be used.

For example, in the first and second embodiments, a case where each side of the irradiation region 56 is parallel or perpendicular to the extension direction of the stripe region 54 has been described as an example. However, each side of the irradiation region 56 may be oblique with respect to the extension direction of the stripe region 54.

For example, in the first and second embodiments, a case where the pattern formed on the semiconductor wafer is inspected has been described as an example. However, for example, embodiments may be applied to the inspection of the pattern of a photomask. In other words, the substrate 101 to be inspected by the electron beam inspection apparatus and the electron beam inspection method according to the embodiments is not limited to the semiconductor wafer. For example, the substrate 101 may be an object, such as a photomask, other than the semiconductor wafer.

In embodiments, a case where the secondary electrons resulting from the substrate 101 are detected and an image is generated has been described as an example. However, for example, reflected electrons may be detected and an image may be generated.

Furthermore, for example, portions which are not directly required to describe embodiments, such as an apparatus configuration and a control method, have not described. However, a necessary apparatus configuration and a necessary control method may be appropriately selected and used.

In addition, all of the electron beam inspection apparatuses and the electron beam inspection methods that include the components of embodiments and can be appropriately designed and changed by those skilled in the art are included in the scope and spirit of embodiments.

What is claimed is:

1. An electron beam inspection apparatus comprising:
 a stage holding a substrate, a pattern being formed on a surface of the substrate;
 an electron beam column irradiating the substrate with multiple beams including a plurality of electron beams such that adjacent irradiation regions irradiated with the electron beams have an overlap portion therebetween;
 a first image storage unit storing a first inspection image acquired by irradiating a first inspection region of the substrate with the multiple beams;
 a second image storage unit storing a second inspection image acquired by irradiating a second inspection region of the substrate with the multiple beams;
 a correction coefficient storage unit storing a correction coefficient for correcting an image of the overlap portion;
 an image correction unit correcting an image of the overlap portion of the first inspection image and an image of the overlap portion of the second inspection image, using the correction coefficient; and
 a comparison unit comparing a corrected first inspection image with a corrected second inspection image.

2. The electron beam inspection apparatus according to claim 1,
 wherein the correction coefficient is determined for each number of times the electron beams are emitted in the overlap portion and defines a correlation between brightness of an image of a non-overlap portion and brightness of the image of the overlap portion, the electron beams not overlapping each other in the non-overlap portion.

3. The electron beam inspection apparatus according to claim 2,
 wherein the correlation is represented by a linear function, and
 the correction coefficient includes a brightness amplitude and an offset grayscale value.

4. The electron beam inspection apparatus according to claim 2,
 wherein the number of times the electron beams are emitted in the overlap portion is two or four.

5. The electron beam inspection apparatus according to claim 1,
 wherein the comparison unit determines whether there is a defect in the pattern of the substrate.

6. An electron beam inspection apparatus comprising:
 a stage holding a substrate, a pattern being formed on a surface of the substrate;
 an electron beam column irradiating the substrate with multiple beams including a plurality of electron beams such that adjacent irradiation regions irradiated with the electron beams have an overlap portion therebetween;
 a first image storage unit storing an inspection image acquired by irradiating an inspection region of the substrate with the multiple beams;

a second image storage unit storing a reference image generated on the basis of a design pattern corresponding to a pattern in the inspection region;

a correction coefficient storage unit storing a correction coefficient for correcting an image of the overlap portion;

an image correction unit correcting at least one of an image of the overlap portion of the inspection image and an image of a portion corresponding to the overlap portion in the reference image, using the correction coefficient; and a comparison unit comparing a corrected inspection image with the reference image, comparing the inspection image with a corrected reference image, or comparing a corrected inspection image with the corrected reference image.

7. The electron beam inspection apparatus according to claim 6, wherein the correction coefficient is determined for each number of times the electron beams are emitted in the overlap portion and defines a correlation between brightness of an image of a non-overlap portion and brightness of the image of the overlap portion, the electron beams not overlapping each other in the non-overlap portion.

8. The electron beam inspection apparatus according to claim 7, wherein the correlation is represented by a linear function, and the correction coefficient includes a brightness amplitude and an offset grayscale value.

9. The electron beam inspection apparatus according to claim 7, wherein the number of times the electron beams are emitted in the overlap portion is two or four.

10. The electron beam inspection apparatus according to claim 6, wherein the comparison unit determines whether there is a defect in the pattern of the substrate.

11. An electron beam inspection method comprising:

acquiring a first inspection image by irradiating a first inspection region of a substrate having a pattern formed on a surface with first multiple beams including a plurality of first electron beams such that adjacent irradiation regions irradiated with the first electron beams have a first overlap portion therebetween;

acquiring a second inspection image by irradiating a second inspection region of the substrate with second multiple beams including a plurality of second electron beams such that adjacent irradiation regions irradiated with the second electron beams have a second overlap portion therebetween;

correcting an image of the first overlap portion of the first inspection image and an image of the second overlap portion of the second inspection image; and comparing a corrected first inspection image with a corrected second inspection image.

12. The electron beam inspection method according to claim 11, wherein the correction is performed using a correction coefficient, the correction coefficient being determined for each number of times the first electron beams are emitted in the first overlap portion or each number of times the second electron beams are emitted in the second overlap portion, the correction coefficient defining a correlation between brightness of an image of a non-overlap portion and brightness of the image of the first overlap portion or the image of the second overlap portion, the first electron beams or the second electron beams not overlapping each other in the non-overlap portion.

13. The electron beam inspection method according to claim 12, wherein the correlation is represented by a linear function, and the correction coefficient includes a brightness amplitude and an offset grayscale value.

14. The electron beam inspection method according to claim 12, wherein the number of times the first electron beams or the second electron beams are emitted in the first overlap portion or the second overlap portion is two or four.

15. The electron beam inspection method according to claim 11, further comprising:

determining whether there is a defect in the pattern of the substrate after the comparison.

16. An electron beam inspection method comprising:

acquiring an inspection image by irradiating an inspection region of a substrate having a pattern formed on a surface with multiple beams including a plurality of electron beams such that adjacent regions irradiated with the electron beams have an overlap portion therebetween;

preparing a reference image generated on the basis of a design pattern corresponding to the pattern in the inspection region;

correcting at least one of an image of the overlap portion of the inspection image and an image of a portion corresponding to the overlap portion in the reference image; and comparing a corrected inspection image with the reference image, comparing the inspection image with a corrected reference image, or comparing a corrected inspection image with a corrected reference image.

17. The electron beam inspection method according to claim 16, wherein the correction is performed using a correction coefficient, the correction coefficient being determined for each number of times the electron beams are emitted in the overlap portion, the correction coefficient defining a correlation between brightness of an image of a non-overlap portion and brightness of the image of the overlap portion, the electron beams not overlapping each other in the non-overlap portion.

18. The electron beam inspection method according to claim 17, wherein the correlation is represented by a linear function, and the correction coefficient includes a brightness amplitude and an offset grayscale value.

19. The electron beam inspection method according to claim 17, wherein the number of times the electron beams are emitted in the overlap portion is two or four.

20. The electron beam inspection method according to claim 16, further comprising:

determining whether there is a defect in the pattern of the substrate after the comparison.

* * * * *